United States Patent
Martin et al.

(10) Patent No.: US 7,426,457 B2
(45) Date of Patent: Sep. 16, 2008

(54) FSM CLOSURE OF GENERALIZED TREE MODELS

(75) Inventors: Alvaro Martin, Palo Alto, CA (US);
Gadiel Seroussi, Cupertino, CA (US);
Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 655 days.

(21) Appl. No.: 10/768,904

(22) Filed: Jan. 29, 2004

(65) Prior Publication Data

US 2005/0168240 A1    Aug. 4, 2005

(51) Int. Cl.
G06F 7/60      (2006.01)
G06F 17/10     (2006.01)
H03M 7/00      (2006.01)
(52) U.S. Cl. .......................................... 703/2; 341/107
(58) Field of Classification Search ..................... 703/2; 341/107
See application file for complete search history.

(56) References Cited

U.S. PATENT DOCUMENTS 5,635,931 A * 6/1997 Franaszek et al. ............. 341/51
5,640,159 A * 6/1997 Furlan et al. ................. 341/51
5,796,356 A * 8/1998 Okada et al. ................. 341/51
7,265,692 B2 * 9/2007 Martin et al. ............... 341/107

OTHER PUBLICATIONS

Nils Klarlund, Michael I. Schwartzbach "Graph Types" ACM 0-89791-561-5/93/0001/0196, 1993, pp. 196-205.*
Alvaro Martin, et al., "Linear Time Universal Coding and Time Reversal of Tree Sources via FSM Closure," HPL-2003-87, Apr. 2003.
R. Giegerich and S. Kurtz, "From Ukkonen to McCreight and Weiner: A unifying view to linear-time suffix tree construction," Algorithmica, vol. 19, pp. 331-353, Nov. 1997.

* cited by examiner

*Primary Examiner*—Paul L Rodriguez
*Assistant Examiner*—Dwin M Craig (57) ABSTRACT

Use of Generalized Context Trees to assign a unique state from a finite set to any string is provided. The method optionally refines the generalized context tree into a refined generalized context tree having a finite state machine (FSM) property. Refining occurs whenever the generalized context tree does not have the finite state machine property. Alternately, a method for constructing a representation of a source usable within an FSM is provided, comprising evaluating a node comprising a suffix tail and verifying the suffix tail is included in the representation, and inserting at least one node to the representation when the suffix tail is not in the representation.

34 Claims, 9 Drawing Sheets

FSM CLOSURE OF GENERALIZED TREE MODELS

BACKGROUND OF THE INVENTION

1. Field of the Invention

The present invention relates generally to the field of data structures employed in symbol prediction, and more specifically to improved modeling of sources using tree structures.

2. Description of the Related Art

Information sources emit symbols from a given alphabet according to some probability distribution. Finite memory sources employ a finite number of contiguous past symbols to determine the conditional probability of the next emitted symbol. In many instances employing conditional probability prediction, the memory length, i.e. the number of past symbols that determine the probability distribution of the next one, depends on the data received and can vary from location to location. Due to this variance in memory length, a Markov model of some order m fit to the data is generally not efficient in determining conditional probability for next emitted symbols. In such a Markov model, the number of states grows exponentially with m, thus providing a significantly complex resultant model including equivalent states that yield identical conditional probabilities. In general, when considering a Markov model, removing redundant parameters and reducing the total number of states can provide enhanced overall performance.

Reduced Markov models have been termed "tree sources," as they can be graphically represented using a simple tree structure. A "tree source" includes an underlying full $\alpha$-ary context tree structure and a set of conditional probability distributions on the alphabet, one associated with each leaf of the tree, where each leaf corresponds to a "state." An $\alpha$-ary context tree structure includes, for example, binary trees, tertiary trees, and so forth, where a is the size of the source alphabet. The appeal of tree sources is the ability to capture redundancies typical of real life data, such as text or images, while at the same time providing the ability to be optimally estimated using known algorithms, including but not limited to the Context algorithm. Tree sources have been widely used for data modeling in data compression, but are also useful in data processing applications requiring a statistical model of the data, such as prediction, filtering, and denoising.

The problem with using tree sources is the cost associated with transitioning from one state to the next state. In principle, for a general tree source, knowledge of the current state and the next input symbol might not be sufficient to determine the next state. Determination of the latter generally entails traversing the tree from its root, and following branches according to the sequence of symbols preceding the current symbol. For general trees, such procedure will require a number of steps that cannot be bounded by a constant. Thus, transitioning from one state to another is generally expensive from a computational perspective, and use of such trees can add complexity to the system.

Based on the foregoing, it would be advantageous to offer a relatively simple representation of tree sources that may allow state transitioning in an efficient manner, ideally requiring a constant number of operations per input symbol, or, equivalently, total execution time linear in the length of the input data size.

SUMMARY OF THE INVENTION

According to a first aspect of the present design, there is provided a method of modeling a source as a generalized context tree and a set of probability distributions conditioned on conditioned on states of the generalized context tree. The method comprises determining a probability assigned to a string x by multiplying a probability of each symbol of the string x conditioned on a corresponding state of the generalized context tree determined by a longest context of the symbol in the string x.

According to a second aspect of the present design, there is provided a method of extending a generalized context tree to have a finite state machine (FSM) property, the generalized context tree having a tree structure. The method comprises verifying that each tail of all states having a tail is included in the tree structure by recursively inserting and processing all missing nodes, and optionally refining the tree structure using a structure of pointers pointing from a node w to the nearest ancestor of w in the generalized context tree.

According to a third aspect of the present design, there is provided a method of refining a generalized context tree by a finite state machine. The method comprises verifying that each tail of all states having a tail is included in the tree structure by recursively inserting and processing all missing nodes, refining the tree structure using a structure of pointers pointing from a node w to the nearest ancestor of w in the original generalized context tree, and defining a next state function by making suffix node tail(w) point to w for a symbol head(w) in the pointer structure and making node w inherit missing transitions from its parent.

According to a fourth aspect of the present design, there is provided a method for constructing a representation of a state assignment function of a model of a source, the representation comprising at least one node and at least one leaf, and the representation being usable within a finite state machine (FSM). The method comprises evaluating a node of the representation comprising a suffix tail and verifying the suffix tail of the node is included in the representation; and inserting at least one node to the representation to form a modified representation when the suffix tail is not included in the representation.

According to a fifth aspect of the present design, there is provided a method for representing a state assignment function of a model of a source. The method comprises forming a generalized context tree having at least one node and refining the generalized context tree when necessary, thereby forming a refined generalized context tree. Refining the generalized context tree comprises providing the generalized context tree with at least one additional node, thereby enabling the refined generalized context tree to have a finite state machine property.

According to a sixth aspect of the present design, there is provided a method for extending a generalized context tree to have a finite state machine (FSM) property. The method comprises establishing a tree structure T', selecting a node w in T' that has not been processed, and inserting suffix tail(w) in T' if suffix tail(w) is not a node in T'.

According to a seventh aspect of the present design, there is provided a method of modeling a source as a generalized context tree having finite state machine (FSM) properties. The method comprises establishing a tree structure having a plurality of states, wherein each state has a conditional probability associated and may comprise a tail, verifying that each tail of all states having at least one tail is included in the tree structure by recursively inserting and processing any missing nodes, assigning to each inserted node the same conditional probability as its parent, and building a transitions structure that determines a next state function for each permanent and transient state that forms a node of the tree structure.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present design operates by taking a source, constructing a Generalized Context Tree (GCT) that models the source, optionally refining the GCT by adding leaves and/or internal nodes, where necessary, such that the refined GCT has a finite state machine (FSM) property. These additions are referred to as computing a "FSM closure" on the GCT, thereby forming a resultant tree. Intermediate trees may be formed in the process, such as when filling the GCT with leaves and/or internal nodes. The present design may alternately be considered to receive a string, build a suffix tree of the string in reverse order, prune the suffix tree to form a pruned tree, and build a finite state machine (FSM) closure of the pruned tree to form an FSM closed tree. The present system may also provide information about the pruned tree to a decoder, which can reconstruct the FSM closure and utilize the tree in various ways. Tree construction, encoding, and reconstruction processes may operate in a time frame linear in the length of the input string. Also, the source representation may allow for generating the state sequence corresponding to the input string in time linear in the length of such string.

Definitions

As used herein, the terms "algorithm," "program," "routine," and "subroutine" will be generally used interchangeably to mean the execution functionality of the present design. The term "subroutine" is generally intended to mean a sub program or ancillary algorithm, called from the main program, that may be associated with or subordinate to the main program or algorithm.

Also as used herein, A represents an alphabet of $\alpha$ available symbols, a being greater than or equal to 2. The values $A^*, A^+$, and $A^m$ denote, respectively, the set of finite strings, the set of positive length strings, and the set of strings of length m, where m is greater than 0, over the set of symbols. Variables a, b, and c represent symbols from alphabet A, while r, s, t, u, v, w, x, y, and z represent strings in $A^*$. The notation $x_i$ is used to denote the i-th symbol of x, while $x^i$ denotes the sub string $x_1 x_2 \ldots x_i$. The reverse of a string x is $\bar{x}$, equal to $x_k x_{k-1} \ldots x_1$, where k is the length of x. Length of a string x is represented as |x|. The null string, a string of length zero, is denoted $\lambda$. "uv" is the concatenation of strings u and v.

Further, as used herein, the terms "prefix" and "suffix" are illustrated by, for example, a string t equal to uvw, where u, v, and w are also strings. In this case, u is a "prefix" of t, v is a "t-word," and w is a "suffix" of t. The phrase "u is a prefix of v" is written as "$u \leq v$." If u is prefix of v and |u| is less than |v|, u is said to be a "proper prefix" of v. An analogous definition applies to "proper suffix". For a string u, head(u) is the first symbol of u, and tail(u), also known as the suffix tail, is its longest proper suffix.

Figure 2:
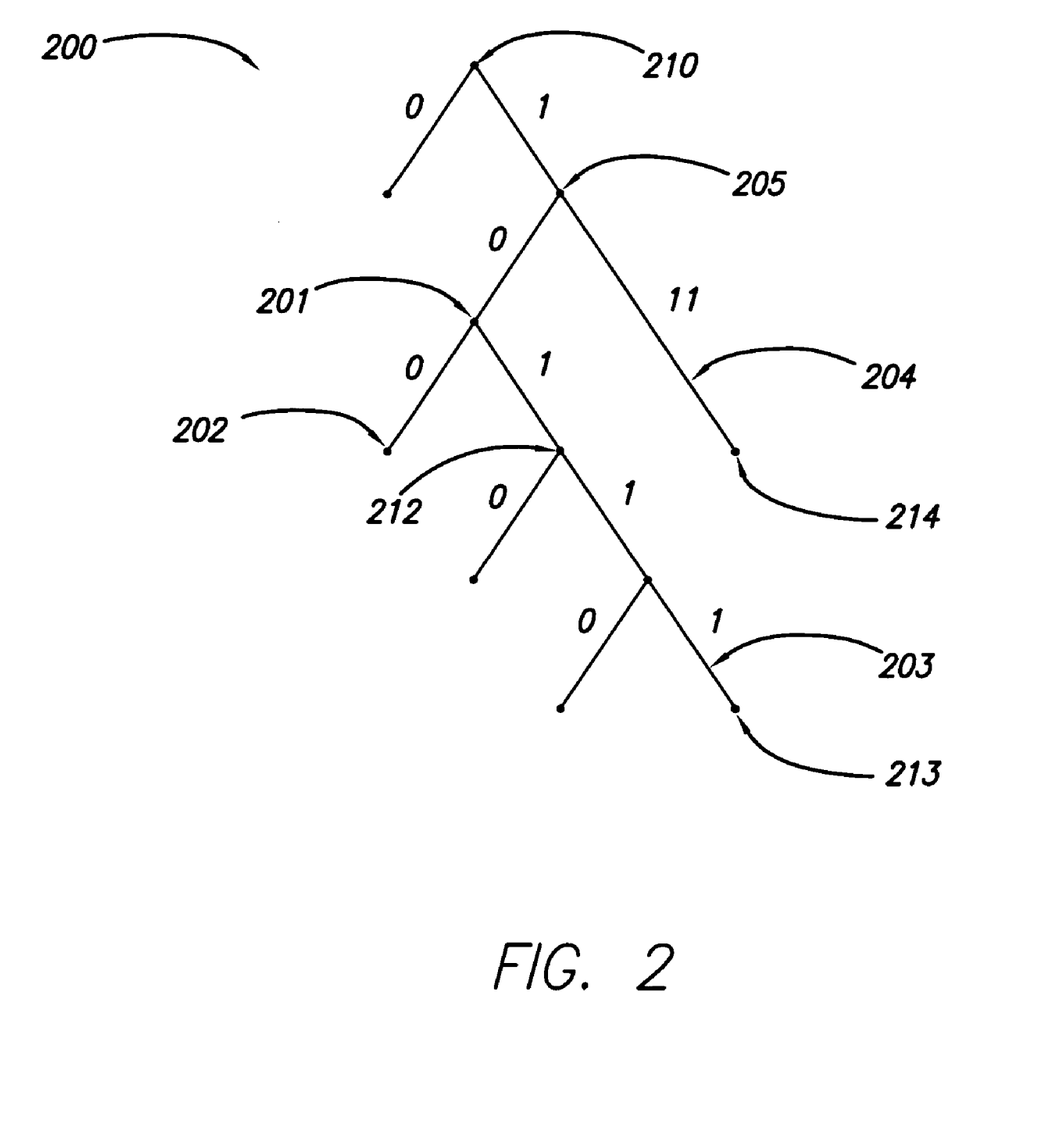
FIG. 2 represents a binary tree structure.

A typical binary tree structure is illustrated in FIG. 2 for purposes of identifying the terminology used herein. Tree structure 200 includes a set of "nodes" such as node 201 or node 202. Nodes are joined by "edges," such as edge 203. Edges are assumed to be directed, or have a direction associated therewith. In the example binary tree structure of FIG. 2, and in the other illustrations of this application, edges are directed from top to bottom. If there an edge originates at node x and ends at node y, x is the "parent" of y, and y is a "child" of x. Each node has a unique parent, except for one distinguished node referred to as the "root." In FIG. 2, node 210 is the root, and node 201 is the parent of nodes 202 and 212, which are the children of node 201. A "leaf" is a node with no children, such as node 202. An "internal node" is any node, such as node 201, that is not a leaf.

Each edge in the tree is labeled with a string from $A^+$, such as string "11" in edge 204, or string "1" in edge 203. Edges departing from a node are typically labeled with strings starting with different symbols, and each node has at most as many children as the size of the alphabet $\alpha$. An edge is "atomic" if it is labeled by a single-symbol string, such as edge 203 in FIG. 2. An edge that is not atomic is called "composite," such as edge 204. The term "atomic tree" designates a tree where every edge in the tree is atomic. Every node in a tree is associated with a string, composed by concatenating the labels of all the edges in the path from the root to the node. For example, in FIG. 2, node 213 is associated with the string "10111," and node 214 is associated with the string "111." Nodes are identified herein by their associated strings. For instance if u is a string, the node whose associated string equals u will be simply referred to as "node u". Also, all operations defined over strings may be applied to nodes with the understanding that the operations are applied to the associated strings. For example if v is a node, |v| denotes the length of the string associated to node v.

Figure 4:
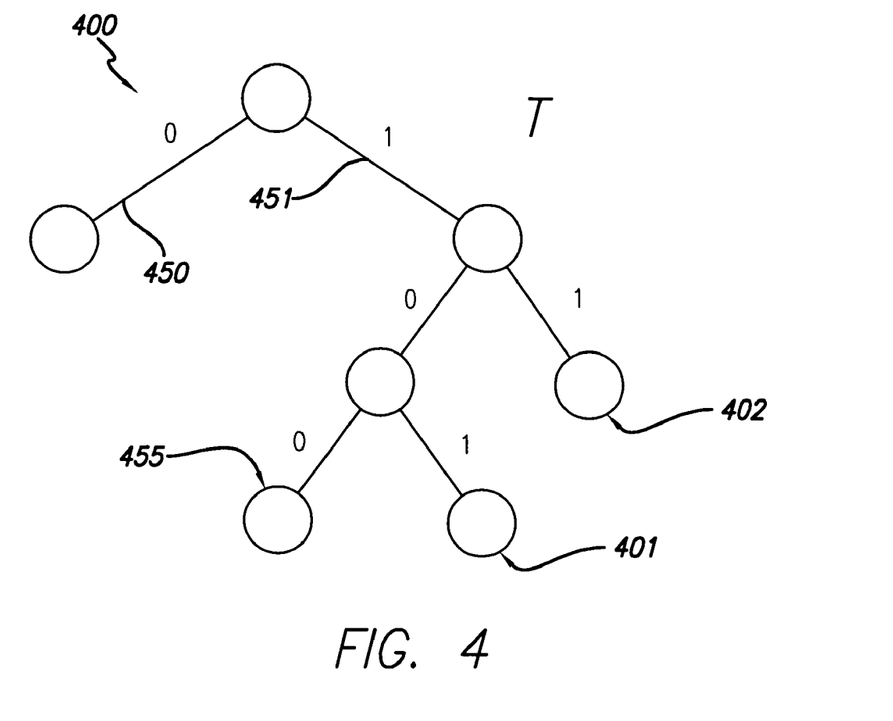
FIG. 4 is a binary context tree.

A node is called a "branching node" if it has at least two children. A tree is "compact" if every node in T is either the root, a leaf, or a branching node. A tree is "full" if the tree is atomic and the number of branches emanating from every node is either zero or $\alpha$, where $\alpha$ is the size of the alphabet A. In the case of a binary tree, for example, $\alpha$ is 2, and a full tree has two branches emanating from every internal node, with no branches emanating from any leaf. FIG. 4 illustrates a full binary tree.

Consider a string $x_1 x_2 \ldots x_n$, and its substring $x_1 x_2 \ldots x_i$, with i less than n, and a full tree T. Starting at the root, and following branches by matching their labels to symbols from the reversed substring $x_i x_i -1 \ldots x_1$, one eventually reaches a leaf of T, provided the number i is large enough (e.g., larger than the length of the longest string associated with a leaf of T). That leaf is referred to as the "state" determined by the string $x_1 x_2 \ldots x_i$, which is also the state in which symbol $x_{i+1}$ is processed in data processing applications using the tree T. For example, for the tree T of FIG. 4, the state determined by string "010111" is leaf 402. Full trees used for determining states are termed "context trees" as the state used for processing $x_{i+1}$ corresponds to a sub string of x preceding $x_{i+1}$, known as a "context" for that occurrence of the symbol in x.

When a tree T is not full or when it is not atomic, nodes that are not leaves may determine states. In general, for sufficiently large i, the state determined by $x^i$ is the last node of the tree visited while traversing the tree as described above, before "falling off" the tree. For example, for the tree of FIG 2, the state determined by string "1010011" is node 205. In this case, the tree is termed a Generalized Context Tree, or GCT.

A tree can be considered a set of strings, namely the set of strings associated with the tree's nodes and all its prefixes. Each string belonging to the set of strings represented by a tree T is said to be a word of T and the set may be denoted WORDS(T).

As used herein, the term "suffix tree" is used interchangeably with the term "compact suffix tree". The suffix tree or compact suffix tree of a string t refers to a compact representation of a tree T such that WORDS(T) equals the set of all t-words.

Figure 1:
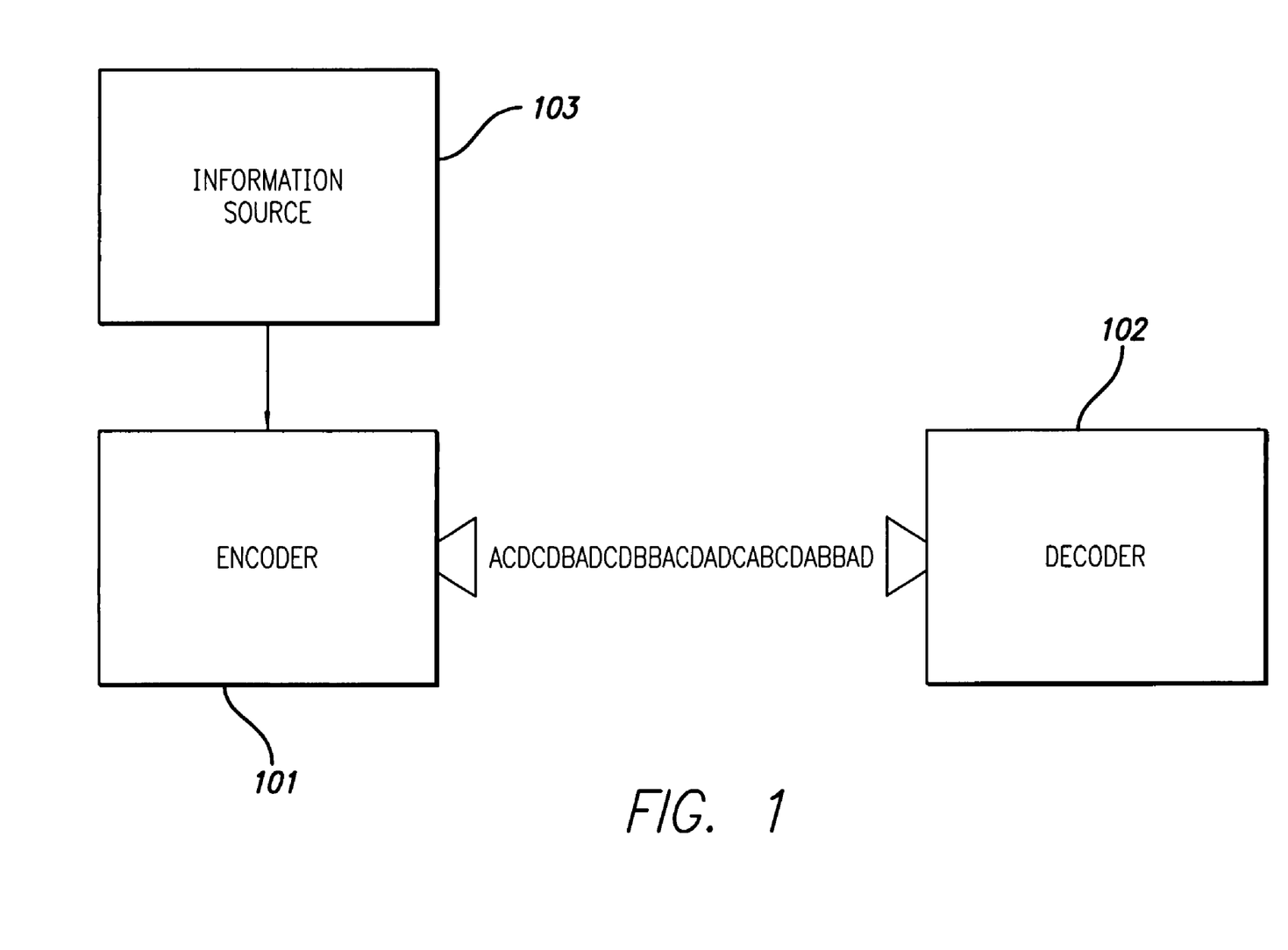
FIG. 1 illustrates a basic encoder-decoder design for a source, such as an information source.

FIG. 1 illustrates a simplified version of an arrangement wherein the present design may be employed. Encoder 101 encodes the symbol stream received from a source 103, such as an information source, and may contain the algorithm disclosed herein as well as the hardware on which the algorithm operates. Alternately, a third location (not shown) may be employed to operate the algorithm and transmit the optimized tree structure(s) to the encoder 101 and decoder 102. Decoder 102 receives the tree structure and thus the states computed by the algorithm, as well as the encoded series of symbols, and decodes the symbols and reassembles the string. In a typical environment, the medium for transmission may be over the air, over wire, or any other medium known for transmission of signals.

Generalized Context Trees and Finite State Machines

Generalized Context Trees and Finite State Machines are two different ways of assigning a unique state from a finite set to any string $x^k$ of $A^*$. In the case of GCTs, the state is determined, for sufficiently long strings, by the last node visited while traversing the tree from the root following the path determined by $\bar{x}$, before "falling off" the tree. More formally, for a GCT T and arbitrary string y, the canonical decomposition of y with respect to T is $C_T(y)$ equals (r, u, v), where r is the longest prefix of y that is a node of T. ru is the longest prefix of y that is a word of T, and y equals ruv. The first component of $C_T(y)$, namely r, is denoted $V_T(y)$.

Figure 3:
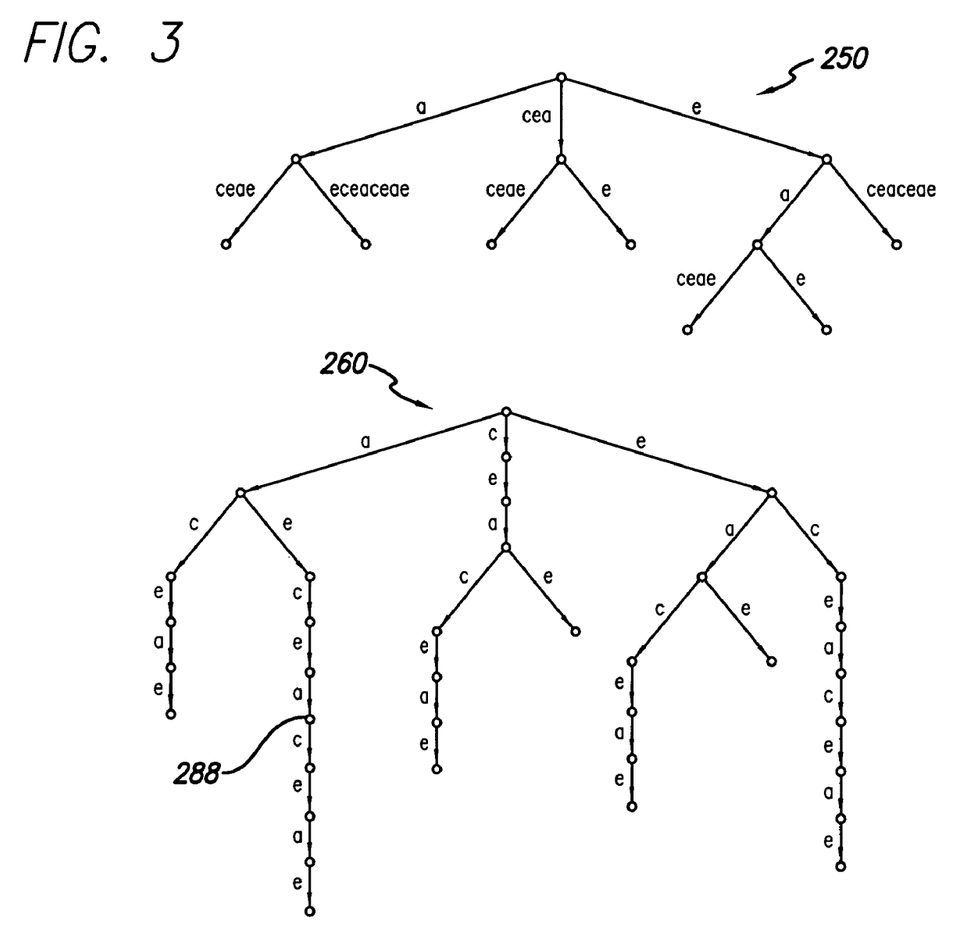
FIG. 3 presents two trees for the string aeceaceae.

As shown in FIG 3, a canonical decomposition follows the path defined by y starting at the root and proceeds down the tree T by matching symbols on its edge labels. r is the last node visited, and v is the suffix of y starting at the mismatch point, or the part of y that falls off the tree. From FIG 3, assume y is the string aeceaecae. For the upper tree 250, beginning with the root, progression moves forward to node a and symbols e,c,e,a before falling off. In this case, r equals node a, u equals "ecea" and v is "ecae". For the non-compact lower tree 260 of FIG. 3, beginning with the root, progression moves forward to a, e, c, e, a, and then the "ecae" string falls off the tree. Thus node 288 is the last node, or r, u is the null string and v is the suffix "ecae." r, u, and/or v may be null strings.

For a given tree T, $S_T$ represents the set of nodes s such that s has less than $\alpha$ children, or s has a composite outgoing edge. $S_T^\$$ denotes the set of strings w$ where $ is a special symbol that does not belong to the alphabet, and w is a word of T that is not a leaf of T. The set of states for T is defined as the union of $S_T$ and $S_T^\$$, $S_T^A = S_T \cup S_T^\$$.

The function that assigns states to strings for a given tree T is known as the "tree-state function" and is defined as $s^T: A^* \to S_T^A$ and $$s_T(x^n) = \begin{cases} V_T(\bar{x}^n) & \text{if } V_T(\bar{x}^n z) = V_T(\bar{x}^n) \ \forall z \in A^* \\ \bar{x}^n \$ & \text{otherwise.} \end{cases} \quad (1)$$

The symbol $ can be interpreted as a conceptual marker preceding the first actual symbol of $x^n$.

The first case of Equation (1) is true for sufficiently long strings, and in this case $s_T(x^n) \in S_T$. For short strings, the second case in Equation (1) may be true, in which case $s_T(x^n) \in S_T^\$$. Note that only one string selects each state in $S_T^\$$. These states are called "transient states". On the other hand, arbitrarily long strings select states in $S_T$, and these states are termed "permanent states".

When T is a "full tree," the set of permanent states of GCT T is equal to the set of end nodes or leaves. For the BCT of FIG. 4, for example, $S_T$, or the set of states of tree T, is {0, 100, 101, 11}.

A GCT T and a set of probability distributions on symbols of the alphabet conditioned to states of T can be used as a model for a finite memory source. Such a model is termed a Generalized Context Tree Source (GCT Source). The probability assigned by a GCT source with tree T to a string $x^n$ is:

$$P(x^n) = \prod_{i=1}^{n} P(x_i \mid s_T(x^{i-1})) \quad (2)$$

where $P(\alpha|s)$ is the probability of symbol a conditioned on the state s.

As a GCT does not need to be full, a GCT Source can group sibling leaves of a tree source sharing the same probability distribution in one single state. Thus, use of GCT Sources may provide advantages over tree sources in terms of number of states, in the same way tree sources do over plain Markov models.

A finite state machine (FSM) over A is defined as:

$$F = (S, f, s_o) \quad (3)$$

where S is a set of states, f: $S \times A \to S$ is a next state function, and $s_o$, an element of S, is the initial state. For an FSM, the state function is recursively defined by the next state function starting from initial state $s_0$, or in other words the state assigned to a string $x^k$ is f( .... f(f($s_0$, $x_1$), $x_2$) ..., $x_k$). The concept of permanent state is also defined for an FSM where a state s is "permanent" if there exist arbitrarily long strings $x^i$ such that $f(\ldots f(f(s_0, x_1), x_2) \ldots, x_1)$ equals s, or in other words $x^i$ selects state s.

A GCT has the FSM property, or the tree "is FSM," if the tree T defines a next state function $f: S_T^A \times A \to S_T^A$ such that for any sequence $x^{n+1}$, $$s_T(x^{n+1}) = f(S_T(x^n), x_{n+1})) \qquad (4)$$

For the binary tree of FIG. 4, the state following the transmission of a 1 at state 0 in tree 400 could either be "100" or "101." The tree therefore does not have the finite state machine property. The system therefore needs additional past symbols to make a conclusive determination of the state beyond the symbols provided by the length-one context at root node 403.

One possible way of verifying whether a GCT T is FSM is by means of the "suffix property." If, for every permanent state s, the suffix tail(s) is a node of T, then T is FSM. In this case, the next state function f satisfies, for all $a \in A$, $f(s,a)$ equals $V_T(as)$, where $V_T(as)$ represents the first element, r, of $C_T(as)$.

Note that the GCT 400 in FIG. 4 does not satisfy the suffix property because the descendants of node 451 are not replicated at node 450, i.e. neither suffix "00" nor suffix "01" is present. To make a tree T that is not FSM into a tree that is FSM, the system must add nodes and/or edges to the tree T to ensure conformance with Equation (4).

The present design computes a GCT $T_{suf}$ by taking T and adding, as nodes, all suffixes of the nodes of T. Addition of a node may cause a composite edge, or an edge labeled with more than one single letter string, to split. If, for example, w is a node of T with an outgoing edge uv, and the construction of the suffix tree calls for adding the node wu, the edge w→wuv is split into w→wu→wuv.

$T_{suf}$ is a "refinement" of T, where refinement means a "refinement function" g exists such that $S_T(x) = g(S_{T_{suf}}(x))$ for every string x. In other words, given the state assigned by $T_{suf}$ to a string x, the system can determine the state assigned by T even if x is unknown. A GCT can be refined by or be a refinement of an FSM or another GCT. A "minimal" refinement of a GCT T which is FSM, but is not necessarily a tree, is called an "FSM closure" of T, where minimal in this context indicates having a minimal number of permanent states. $T_{suf}$ is one possible FSM closure of T.

Figure 5:
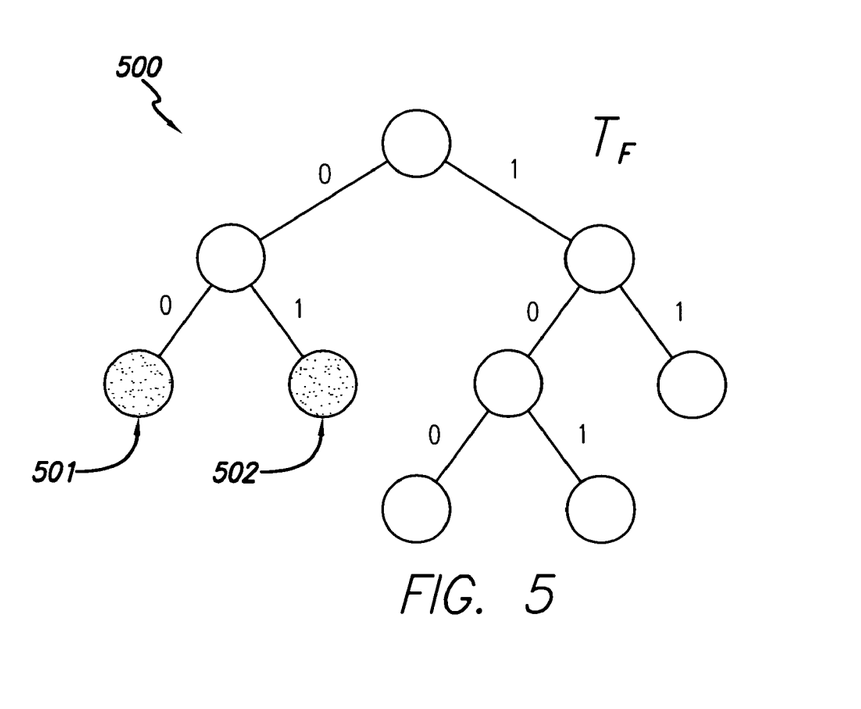
FIG. 5 shows an FSM closure of the non-FSM closed binary context tree of FIG. 4, including two new leaves.
Figure 6:
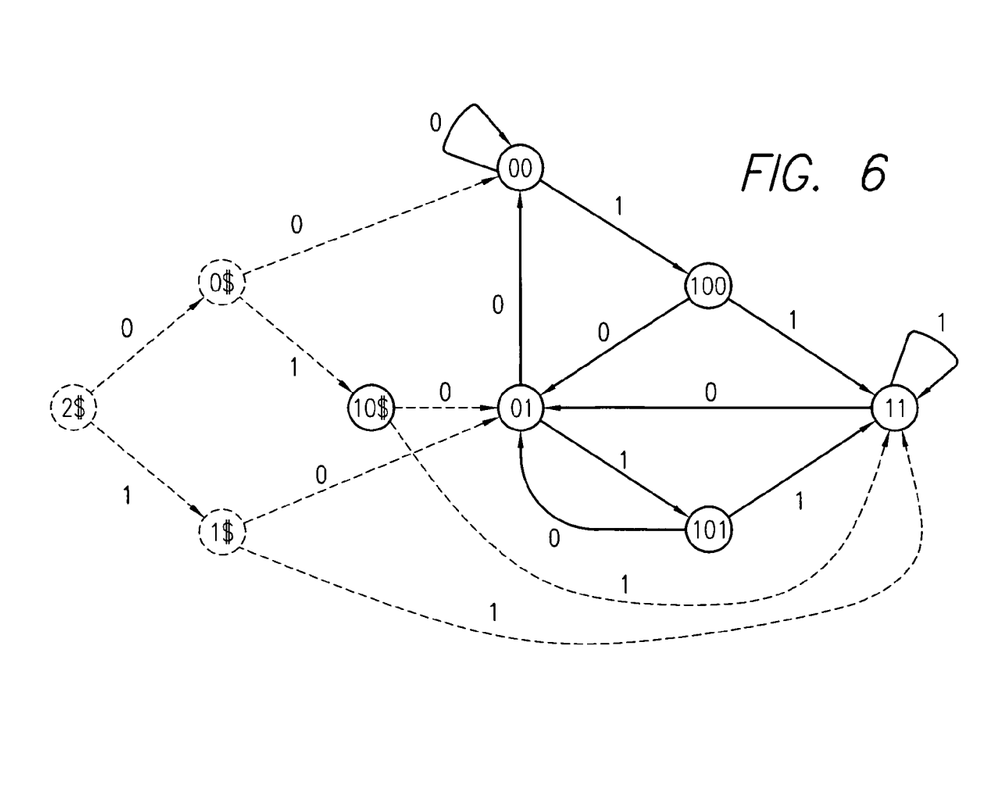
FIG. 6 shows the finite state machine associated with the $T_f$ of FIG. 5.

FIG. 5 illustrates a GCT $T_F$ having FSM properties which is an FSM closure of the tree of FIG. 4. New nodes 501 and 502 added to the tree T are shaded. FIG. 6 shows the finite state machine associated with the tree $T_F$ of FIG. 5. Transient states and their transitions are indicated by dashed lines.

FSM Closure Algorithm

Construction of $T_{suf}$, an FSM closure for an arbitrary GCT T, can be achieved by means of the algorithm described herein that may operate in a time frame linear in the sum of edges lengths over all edges of T and the number of nodes in $T_{suf}$. The algorithm begins with a representation of T and adds necessary nodes and edges. The algorithm also builds a structure Transitions[w] that determines the next-state function for each permanent state w and for each transient state w$ such that w is also a node of $T_{suf}$. The algorithm verifies that all nodes w exist such that tail(w) is also in the tree. The algorithm recursively inserts and processes all missing nodes. After the algorithm finds or creates tail(w), the algorithm updates Transitions[tail(w)] to indicate that the next state function from tail(w), for symbol head(w), leads to w. Once the algorithm verifies all nodes, the algorithm has constructed $T_{suf}$ and the algorithm starts a final traverse of the resulting tree. For each node w, the algorithm defines transitions for symbols that may be missing by making w inherit the transitions from w's parent. Alternately, the algorithm may make the transitions point to w when w is the root node.

An efficient implementation of the algorithm relies on principles similar to previous suffix tree construction algorithms, and may include, for example, the use of suffix links, i.e. a pointer from w to tail(w), to avoid reprocessing during steps subsequent to verification of w.

The present design uses certain data arrays, including Tail, Traversed, Transitions, Origin, and Children, in the FSM closure algorithm to transition from GCT T to $T_{suf}$. Tail[w] is a pointer for the node in tree T containing w to the node containing tail(w), enabling operation to proceed from w to its suffix in constant time. Traversed[w,a] is a flag indicating whether an attempt was made to traverse an edge starting from node w in the direction of a. Initially set to false for all w and a, for nodes w of T, and new nodes as they are created, and reset to true once there is an attempt to traverse the edge from w in the direction of a. Transitions[w] represents the list of FSM transitions from state w. The notation $f(w,a) = u$ is used to denote an element of Transitions[w]. The notation $f(w,a) = w$ indicates that u is the value of the next-state function for state w and symbol a in the constructed FSM. Transitions[w] is initially empty for all nodes w. Origin[w] is the original node in T from which w descends, i.e. the refinement function from $T_{suf}$ into T. Origin[w] initially is w for all nodes w in T. Children[w] is the list of children of node w.

The present design includes three basic subroutines, Verify (w), Insert (r, u, v), and PropagateTransitions (F,s). Verify receives a node w of T' and verifies that the suffix tail(w) is in T'. If the suffix tail is not included in T', the Verify subroutine adds at least one node to tree T'. The design traverses the entire tree and verifies the inclusion of all suffix tails within the tree T' using recursive calls to the Verify subroutine. The Verify subroutine enables the tree T to be recursively converted to $T_{suf}$ using the intermediate tree T'. The Insert subroutine receives a node r of T' and strings u and v. The Insert subroutine inserts, if necessary, new nodes ru and ruv, performing necessary edge splits and node additions. PropagateTransitions adds a set of state transitions, originating from state s, derived from a set of state transitions F, to the description of the FSM associated with $T_{suf}$.

Figure 7:
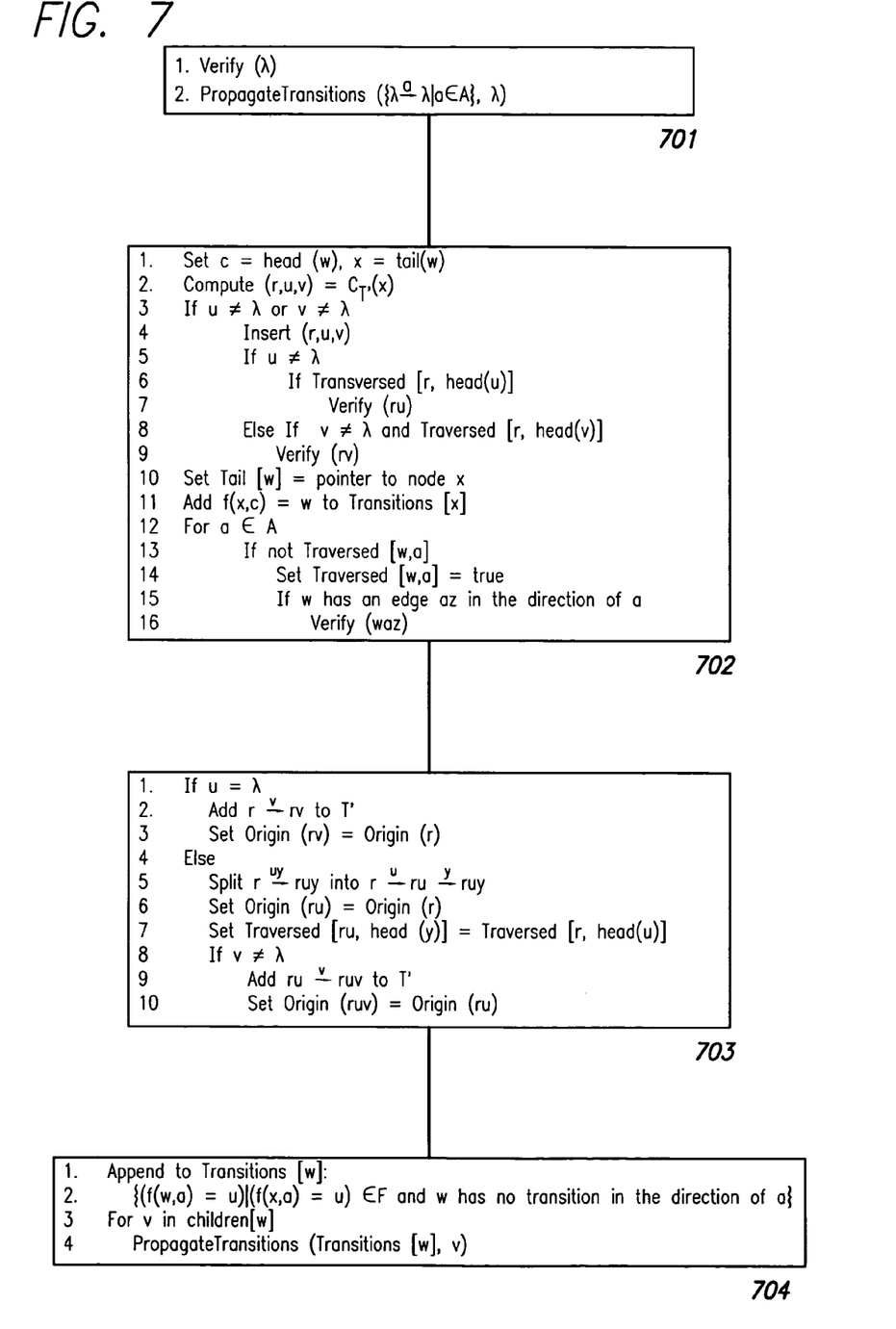
FIG. 7 illustrates an embodiment of the present FSM closure algorithm.

FIG. 7 is an embodiment of the process illustrating computation of $T_{suf}$. Subroutine 701 provides initial conditions, first verifying the root X and propagating transitions from the root. Verify subroutine 702 sequentially verifies suffixes to belong to the tree $T_{suf}$. The Verify subroutine 702 is called with the node w, initially sets c equal to the head of string w and x equal to the tail of w, and computes (r, u, and v) based on tail(w), setting it equal to $C_{T'}(x)$, or (r, u, v), which is the canonical decomposition of x in T'. As long as u and v do not equal the null string (λ), Verify subroutine 702 inserts (r, u, v) via Insert subroutine 703. If u is not equal to λ, and the edge from r to head(u) has not been traversed, Verify subroutine 702 verifies ru. This Verify subroutine call within the Verify subroutine means a recursive calling of the subroutine with the argument ru in place of the argument w. Otherwise, if v is not λ and the edge from r to the head of v has not been traversed, the Verify subroutine recursively calls the Verify subroutine with the argument rv. Verify subroutine 702 then sets Tail[w] to be a pointer to node x. The transition $f(x,c) = w$ is then added to Transitions[x], and for all a in A, if an edge from w to a has not been traversed, Verify subroutine 702 sets Traversed [w,a] to true. If w has an edge az in the direction of a, the program calls Verify with the argument waz.

The tail computation in step 1 of the Verify subroutine 702 reads the symbols of x as a substring of w, and w is a pointer used as input to Verify. In step 10 of the Verify subroutine, there exists a pointer to the node labeled x in T'. The Verify subroutine 702 stores the pointer to the node labeled x in the Tail array for later use.

Insert subroutine 703 is called with the arguments (r, u, v) and initially checks whether u is equal to $\lambda$. If u is equal to $\lambda$, the Insert subroutine 703 adds node rv with edge v emanating from node r to the tree T', and sets Origin(rv) to Origin(r). If u is not equal to $\lambda$, Insert subroutine 703 splits the edge labeled uy departing from r to node ruy and inserts node ru. The Insert subroutine 703 then sets Origin(ru) to Origin(r), and sets Traversed (ru, head(y)) to be equal to Traversed (r, head(u)). If v is not equal to $\lambda$, the Insert subroutine 703 adds node ru, edge v emanating therefrom, and node ruv to T' and sets Origin(ruv) equal to Origin(ru).

PropagateTransitions subroutine 704 is called with the arguments F and W, and appends to Transitions[w] all transitions $f(w,a)=u$, where $f(x,a)=u$ belongs to F for some x and w has no transition in the direction of a. For v in Children[w], PropogateTransitions propagates transitions from Transitions[w] to v.

The algorithm adds transitions of the form $f(x,c)=cx$ of the FSM associated with $T_{suf}$, in Step 11 of the Verify subroutine 702. The foregoing algorithm adds transitions of the form $f(x,c)=u$, which is an ancestor of cx, in the PropogateTransitions subroutine.

Figure 8:
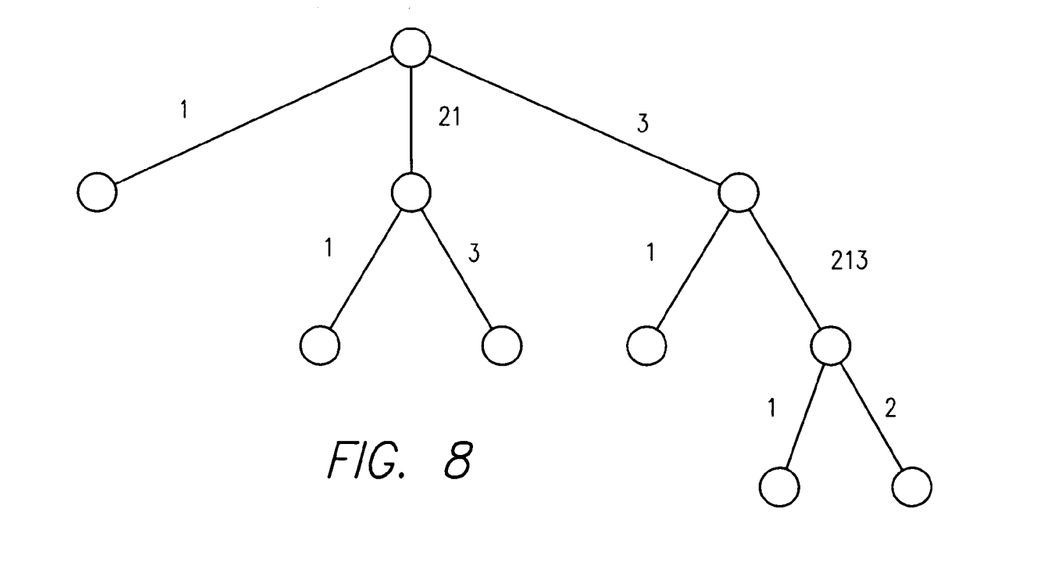
FIG. 8 shows a non-FSM closed suffix tree employing alphabet {1, 2, 3}.
Figure 9A:
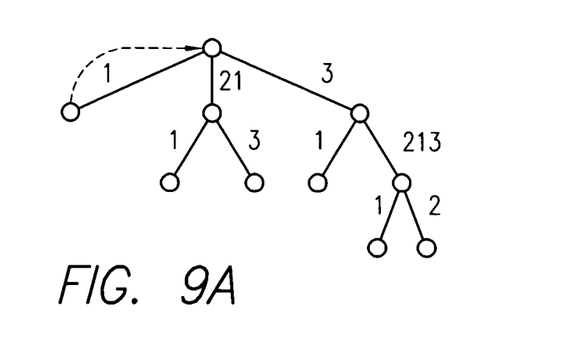
FIG. 9A illustrates a first processing of the FSM closure of the tree structure of FIG. 8, performed in accordance with the embodiment of FIG. 7.
Figure 9B:
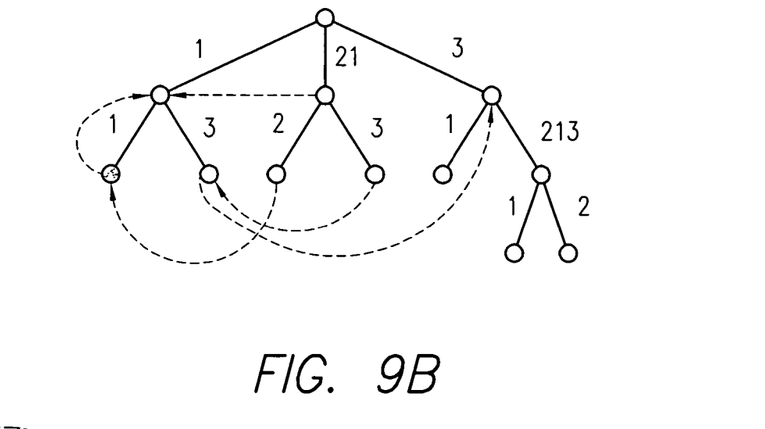
FIG. 9B is a second processing of the FSM closure of the tree structure of FIG. 8 performed in accordance with the embodiment of FIG. 7.
Figure 9C:
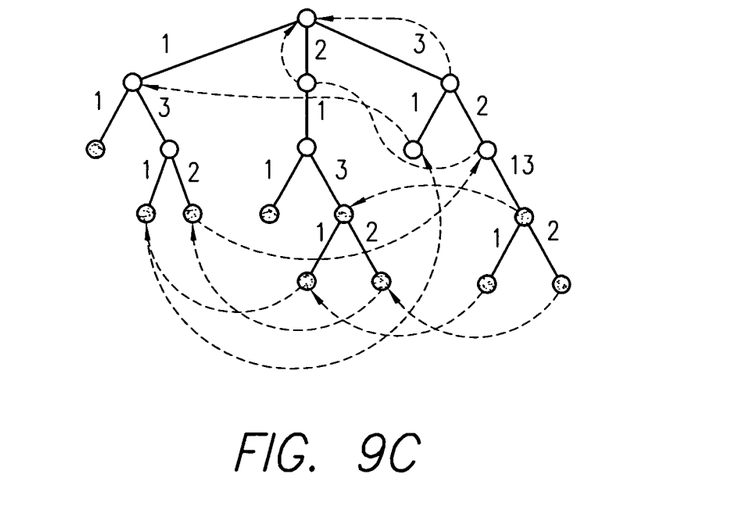
FIG. 9C shows a third processing of the FSM closure of the tree structure of FIG. 8 performed in accordance with the embodiment of FIG. 7.

Operation of the algorithm of FIG. 7 is illustrated in FIG. 8. FIG. 8 illustrates a GCT T over the alphabet A equal to {1,2,3} that is not FSM. FIGS. 9A, 9B, and 9C present the tree T' 901 and the suffix links created after each iteration of the loop in line 12 of Verify subroutine 702 invoked for the root node.

Walking through Verify subroutine 702 from FIG. 9A to FIG. 9B operates as follows. The algorithm starts by calling Verify(root) at line 1 of MakeFSM. In this invocation, Verify does not introduce any modification until the loop in line 12. At this point, The system calls Verify recursively for nodes 1, 21 and 3. FIGS. 9A, 9B and 9C show the trees after each of these invocations. Verify(21) and Verify(3) lead to more recursive calls whose intermediate stages are not shown in any of these three figures.

The transition from FIG. 9A to FIG. 9B starts with invocation Verify(21). Verify(21) at line 1 determines c is equal to head("21"), which is '2,' while x is equal to tail("21"), which is "1." Lines 2 and 3 determine that since the node 1 is already included in the tree, (r,u,v) is (1, $\lambda$, $\lambda$). The Verify subroutine skips to line 10, which sets Tail[21] to point to node 1. Line 11 adds a transition $f(1, '2')=21$ to Transitions[1]. At lines 12 through 16, the algorithm calls Verify for nodes 211 and 213, as described below.

Verify(211) operates as follows. At line 1, c is set equal to head("211"), or equal to '2,' while x is set equal to tail("211"), or equal to "11." At line 2, since 1 is in the tree but "11" is not a word, (r,u,v) is equal to (1, $\lambda$, "1"). At line 4, the system inserts node 11. At lines 8 and 9, v is not the empty string, and as the Verify subroutine set Traversed[1, '1'] to true by Verify (1), line 14, then the program calls Verify(11).

Verify(11) operates at line 1 by setting c equal to head ("11"), which is '1,' and x equal to tail("11"), which is equal to "1". At lines 2 and 3, since 1 is already in the tree, (r,u,v) is equal to (1, $\lambda$, $\lambda$) and operation skips to line 10. At line 10, the Verify subroutine sets Tail[11] to point to node 1. At line 11, the Verify subroutine adds transition $f(1, '1')=11$ to Transitions[1]. At lines 12 through 16, the Verify subroutine makes no recursive calls, as node 11 has no children, but sets Traversed[11,a] to true for all symbols a.

At line 10, the Verify subroutine sets Tail[211] to point to node 11, while at line 11, the Verify subroutine adds a transition $f(11, '2')=211$, to Transitions[11]. At lines 12 through 16, the program makes no recursive calls, since 211 has no children, but sets Traversed[211,a] to true for all symbols a.

Verify(213) at line 1 sets c equal to the head("213"), or '2,' and x equal to the tail("213"), or "13". At line 2, since 1 is in the tree but "13" is not a word, (r,u,v) is equal to (1, $\lambda$, "3"). At line 4, the Verify subroutine insets node 13. In lines 8 and 9, since v is not the null string and Verify(1) set Traversed[1, '3'] to true at line 14 thereof, then the program calls Verify(13).

Verify(13) at line 1 determines c equals head("13"), or '1,' while x is tail("13"), or "3". At lines 2 and 3, since 3 is already in the tree, the Verify subroutine sets (r,u,v) equal to (3, $\lambda$, $\lambda$) and skips to line 10. At line 10, the Verify subroutine sets Tail[13] to point to node 3. At line 11, the Verify subroutine adds a transition $f(3, '1')=13$, to Transitions[3]. At lines 12 through 16, the Verify subroutine makes no recursive calls since node 13 has no children. The program sets Traversed[13,a] to true for all symbols a.

At line 10, the program sets Tail[213] to point to node 13. Line 11 adds transition $f(13, '2')=213$ to Transitions[13]. For lines 12 through 16, the system makes no recursive calls since 213 has no children, but sets Traversed[213,a] true for all symbols a. This completes addition/insertion of the two leaves and edges as well as verification and associated processing and storage for the newly formed tree elements.

Figure 10:
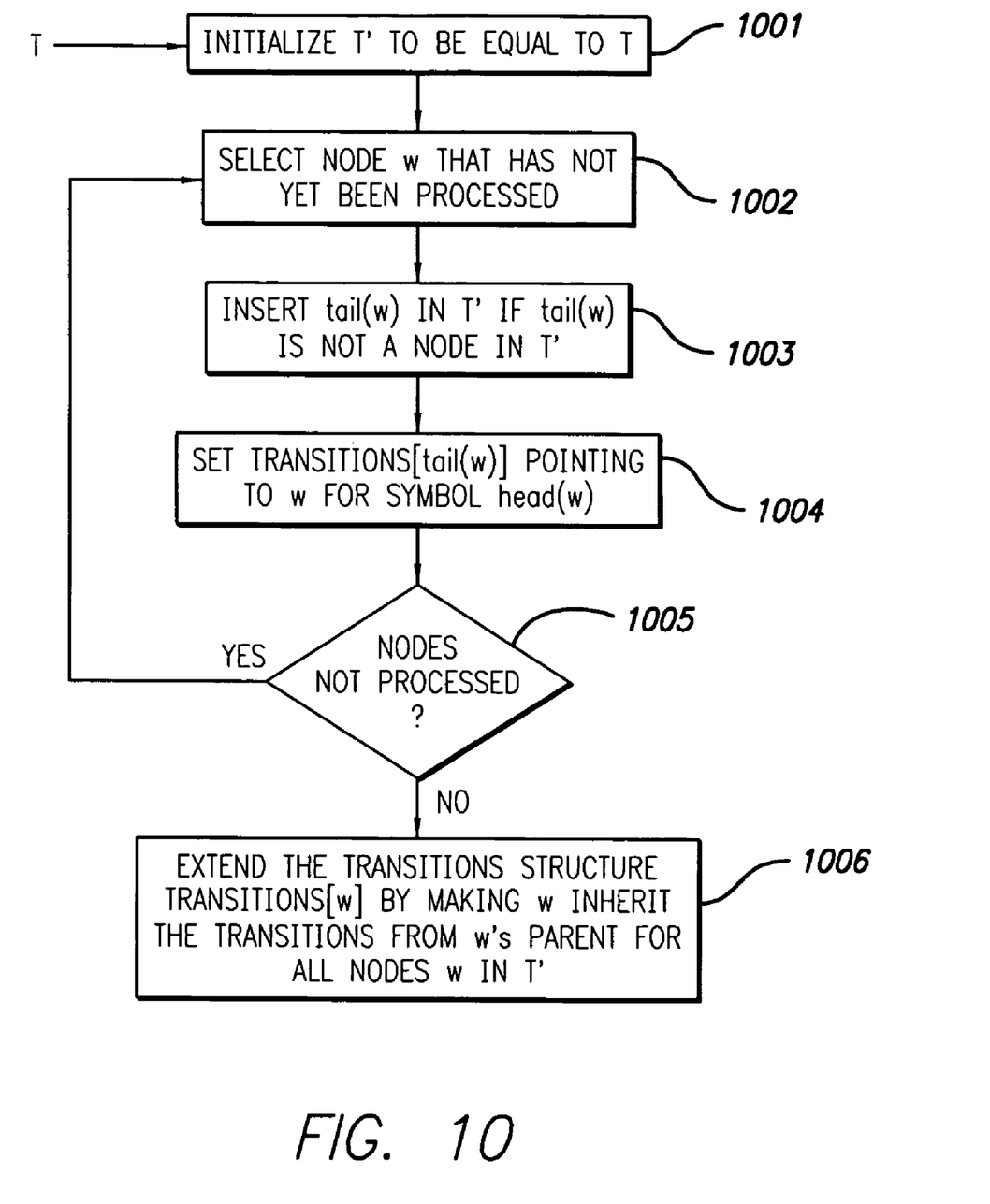
FIG. 10 is a flowchart of an alternate embodiment of the FSM closure algorithm.

FIG. 10 illustrates an alternate embodiment of the current invention. The entire flowchart of FIG. 10 begins with a representation of T and adds necessary nodes and edges to construct $T_{suf}$. Intermediate trees in the process from T to $T_{suf}$ are denoted by T'. The FSM transitions structure is partially built during construction of $T_{suf}$ and completed in the last step of the algorithm. From FIG. 10, Point 1001 initializes T' to be equal to tree T. Point 1002 selects a node w that has not been processed, which can be any node in T'. If it has been processed, another node is selected. At point 1003, the algorithm evaluates tail(w), and determines that if tail(w) is not a node in T', tail(w) is inserted into tree T'. At point 1004, the algorithm sets the Transitions structure Transitions[tail(w)] to point to w for the symbol head(w). Point 1005 evaluates whether nodes exist in T' that have not been processed, and if so, passes back to point 1002 and repeats the process shown for any other remaining nodes. If no further nodes are left, point 1006 of the algorithm extends the Transitions structure Transitions[w] by making w inherit the missing transitions from w's parent for all nodes w in T'. The result from point 1005 is $T_{suf}$, while the result from point 1006 is $T_{suf}$ plus the Transitions structure.

Figure 11:
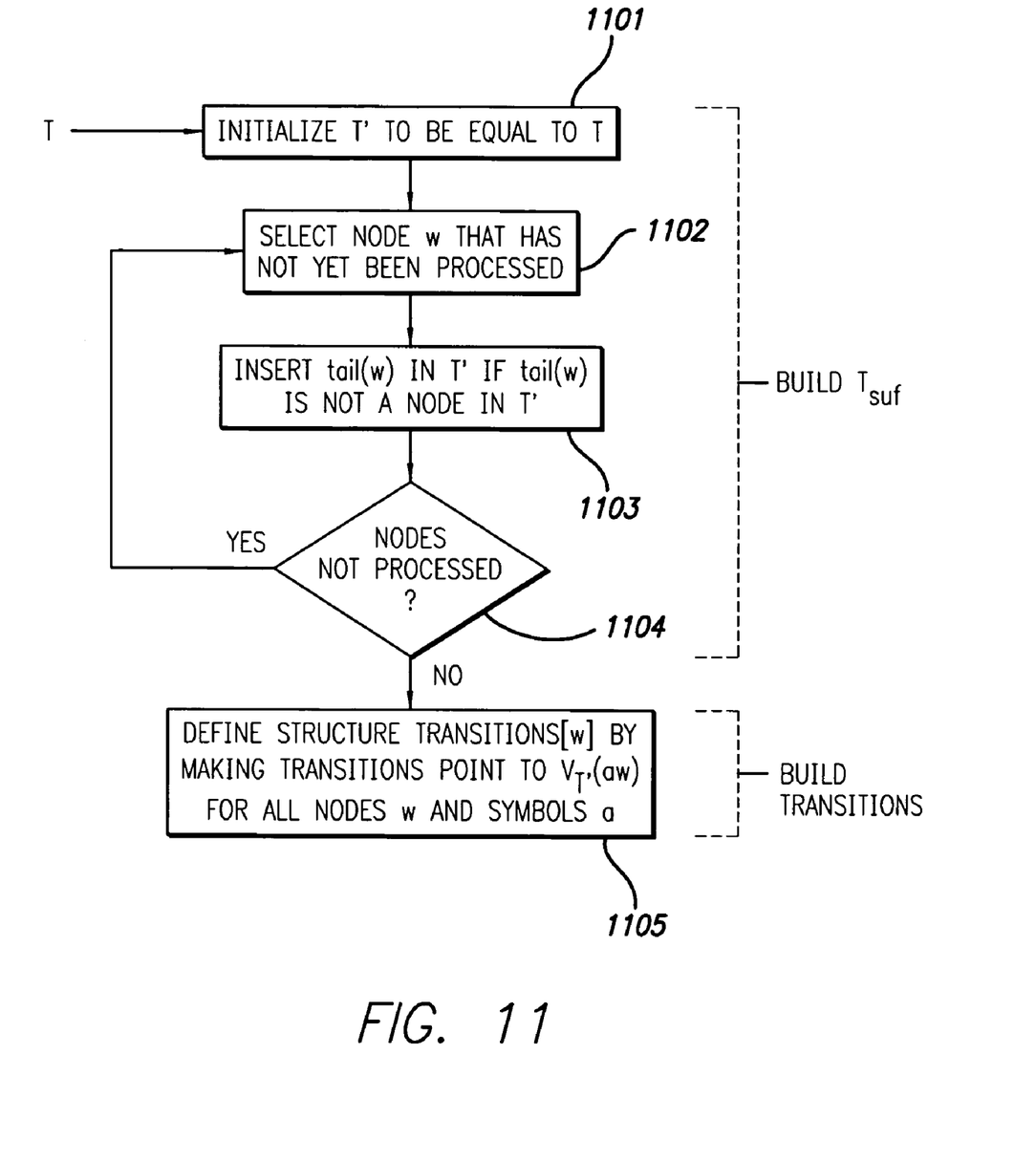
FIG. 11 is a flowchart of another embodiment of the FSM closure algorithm.

Alternatively, the algorithm may separate construction of $T_{suf}$ from construction of the Transitions structure as shown in the embodiment of FIG. 11. From FIG. 11, point 1101 again initializes T' to be equal to tree T. Point 1102 selects a node that has not been processed, and progression through nodes may occur in any logical manner. Point 1103 determines that if tail(w) is not a node in T', the system is to insert tail(w). Point 1104 determines whether additional nodes are to be processed. If so, operation loops back to point 1102. If no further nodes require processing, Tsuf is complete, and the system proceeds to point 1105 to build the Transitions structure. Point 1105 defines the structure Transitions[w] by making Transitions[w] point to $V_{T'}(aw)$, or the first component of the canonical decomposition of aw with respect to T', for all nodes w and symbols a.

Although there has been hereinabove described examples, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A computer-implemented method of modeling an information source in a data communication system as a generalized context tree and a set of probability distributions conditioned on states of the generalized context tree, comprising:
    determining a probability assigned to a string x by multiplying a probability of each symbol of the string x conditioned on a corresponding state of the generalized context tree determined by a longest context of the symbol in the string x;
    wherein the generalized context tree comprises a plurality of nodes connected by edges labeled with a string of symbols from the string x, each node having one incoming edge, and each node capable of being labeled with a finite string obtained by concatenating labels of the edges on a path from root to node; and
    performing at least one of encoding or decoding data symbols in the data communication system based on the modeling of the information source.

2. A computer-implemented method of extending a generalized context tree to have a finite state machine (FSM) property, the generalized context tree having a tree structure, the method comprising:
    verifying that each tail of all states having a tail is included in the tree structure by recursively inserting and processing all missing nodes; and
    optionally refining the tree structure using a structure of pointers pointing from a node w to a nearest ancestor of w in the generalized context tree;
    wherein the tree structure of the generalized context tree comprises a plurality of nodes connected by edges labeled with a string of symbols from a string x, each node having one incoming edge, and each node capable of being labeled with a finite string obtained by concatenating the labels of the edges on the path from the root to the node; and
    performing at least one of encoding or decoding data symbols in a communication system based on the tree structure of the generalized context tree having a finite state machine (FSM) property.

3. The method of claim 2, further comprising providing a partial definition of a next state function by making suffix node tail(w) point to w for a symbol head(w) in the pointer structure.

4. A computer-implemented method of refining an original generalized context tree by a finite state machine, comprising:
    verifying that each tail of all states having a tail is included in the tree structure by recursively inserting and processing all missing nodes;
    refining the tree structure using a structure of pointers pointing from a node w to a nearest ancestor of w in the original generalized context tree; and
    defining a next state function by making suffix node tail(w) point to w for a symbol head(w) in the pointer structure and making node w inherit missing transitions from its parent; and
    performing at least one of encoding or decoding data symbols in a communication system based on the refined tree structure of the generalized context tree.

5. The method of claim 4, further comprising constructing the pointer structure after extending the generalized context tree to have the FSM property by making w point to the first component of the canonical decomposition of aw with respect to T, for symbol a, for all nodes w and symbols a.

6. The method of claim 1, further comprising refining the generalized context tree into a refined generalized context tree having a finite state machine property, wherein said refining occurs whenever the generalized context tree lacks the finite state machine property.

7. The method of claim 6, wherein optionally refining comprises optionally adding nodes to the generalized context tree for any missing suffixes of nodes of the generalized context tree and a conditional probability for each added node.

8. The method of claim 7, further comprising assigning an additional conditional probability for each node w added to the generalized context tree, said conditional probability being equal to the conditional probability associated to a node v in the generalized context tree, v being refined by w.

9. The method of claim 6, further comprising adding suffix links to the generalized context tree.

10. The method of claim 7, wherein adding nodes causes a composite edge of the generalized context tree to split.

11. The method of claim 6, wherein said refining provides a resultant finite state machine generalized context tree having a relatively minimal number of states.

12. A computer-implemented method for constructing a representation of a state assignment function of a model of an information source in a data communication system, said representation comprising at least one node and at least one leaf, and said representation being usable within a finite state machine (FSM), the method comprising:
    evaluating a node of the representation comprising a suffix tail and verifying the suffix tail of the node is included in the representation;
    inserting at least one node to said representation to form a modified representation when said suffix tail is not included in the representation; and
    performing at least one of encoding or decoding data symbols in the data communication system based on the constructed representation of the state assignment function of the model of the information source.

13. The method of claim 12, wherein the representation comprises a generalized context tree.

14. The method of claim 12, wherein the representation comprises at least one state, each state associated with one node, and further comprising assigning a conditional probability to each state in the representation.

15. The method of claim 14, wherein inserting comprises adding nodes to the generalized context tree for any missing suffixes of nodes of the generalized context tree.

16. The method of claim 15, further comprising assigning an additional conditional probability for each node w added to the generalized context tree, said conditional probability being equal to the conditional probability associated to a node v in the generalized context tree, v being refined by w.

17. The method of claim 13, wherein inserting at least one node to said representation comprises adding suffix links to the generalized context tree.

18. The method of claim 13, wherein adding the node causes a composite edge of the generalized context tree to split.

19. A computer-implemented method for representing a state assignment function of a model of an information source in a data communication system, comprising:

forming a generalized context tree having at least one node; and refining the generalized context tree, thereby forming a refined generalized context tree;

wherein the generalized context tree comprises a plurality of nodes connected by edges labeled with a swing of symbols from the string x, each node having one incoming edge, and each node capable of being labeled with a finite string obtained by concatenating labels of the edges on a path from root to node, and further wherein refining the generalized context tree comprises providing the generalized context tree with at least one additional node, thereby enabling the refined generalized context tree to have a finite state machine property; and performing at least one of encoding or decoding data symbols in the data communication system based on the refined generalized context tree having the finite state machine property.

20. The method of claim 19, further comprising associating a conditional probability with each state in the generalized context tree.

21. The method of claim 19, wherein refining comprises adding nodes to the generalized context tree for any missing suffixes of nodes of the generalized context tree.

22. The method of claim 21, further comprising assigning an additional conditional probability for each node w added to the generalized context tree, said conditional probability being equal to the conditional probability associated to a node v in the generalized context tree, v being refined by w.

23. The method of claim 19, wherein refining the generalized context tree further comprises adding suffix links to the refined generalized context tree.

24. The method of claim 22, wherein adding nodes causes a composite edge of the generalized context tree to split.

25. The method of claim 19, wherein said forming and refining provide the refined generalized context tree having a relatively minimal number of states.

26. A computer implemented method for extending a generalized context tree to have a finite state machine (FSM) property, comprising:
    establishing a tree structure T';
    selecting a node w in T' that has not been processed;
    inserting suffix tail(w) in T' if suffix tail(w) is not a node in T'; and
    performing at least one of encoding or decoding data symbols in a communication system based on the tree structure T'.

27. The method of claim 26, further comprising establishing a set of conditional probabilities associated to each state of T' upon establishing T'.

28. The method of claim 27, further comprising assigning the same conditional probability to tail(w) as any parent of tail(w) in T'.

29. The method of claim 26, further comprising evaluating whether all nodes have been processed, and if all nodes have not been processed, repeating said selecting and inserting until all nodes have been processed.

30. The method of claim 26, further comprising defining a Transitions structure for the purpose of establishing transitions between nodes in the tree structure T'.

31. The method of claim 30, wherein establishing the Transitions structure comprises making the Transitions structure for node w point to the first component of the canonical decomposition of aw with respect to T', for all nodes w and symbols a.

32. The method of claim 30, wherein establishing the Transitions structure comprises making the tail nodes of node w point to w for each symbol head(w) and making node w inherit missing transitions from w's parent for all nodes in T'.

33. The method of claim 26, further comprising setting a transitions structure for the tails of node w pointing to w for each symbol head(w), said setting occurring after said inserting.

34. A computer-implemented method of modeling an information source in a data communication system as a generalized context tree having finite state machine (FSM) properties, comprising:
    establishing a tree structure having a plurality of states, wherein each state has a conditional probability associated and may comprise a tail;
    verifying that each tail of all states having at least one tail is included in the tree structure by recursively inserting and processing any missing nodes;
    assigning to each inserted node the same conditional probability as its parent;
    building a transitions structure that determines a next state function for each permanent and transient state that forms a node of the tree structure; and
    performing at least one of encoding or decoding data symbols in the data communication system based on the model of the information source as a generalized context tree having finite state machine (FSM) properties.

* * * * *

UNITED STATES PATENT AND TRADEMARK OFFICE
CERTIFICATE OF CORRECTION

PATENT NO. : 7,426,457 B2  
APPLICATION NO. : 10/768904  
DATED : September 16, 2008  
INVENTOR(S) : Alvaro Martin et al.

It is certified that error appears in the above-identified patent and that said Letters Patent is hereby corrected as shown below:

In column 6, line 51, delete "$P(\alpha|s)$" and insert -- $P(a|s)$ --, therefor.

In column 13, line 6, in Claim 19, delete "swing" and insert -- string --, therefor.

Signed and Sealed this

Twentieth Day of January, 2009

JON W. DUDAS  
*Director of the United States Patent and Trademark Office*